US005773336A

United States Patent [19]
Gu

[11] Patent Number: 5,773,336
[45] Date of Patent: Jun. 30, 1998

[54] METHODS OF FORMING SEMICONDUCTOR ACTIVE REGIONS HAVING CHANNEL-STOP ISOLATION REGIONS THEREIN

[75] Inventor: Bon-Youl Gu, Kyungki-do, Rep. of Korea

[73] Assignee: Samsung Electronics Co., Ltd., Suwon, Rep. of Korea

[21] Appl. No.: 748,193

[22] Filed: Nov. 12, 1996

[30] Foreign Application Priority Data

Dec. 30, 1995 [KR] Rep. of Korea .................. 1995 68619

[51] Int. Cl.[6] .............................................. H01L 21/8238
[52] U.S. Cl. .......................... 438/199; 438/228; 438/333; 438/276; 438/291; 438/298; 438/450
[58] Field of Search ................................. 438/199, 289, 438/291, 168, 205, 217, 218, 298, 228, 233, 276, 450

[56] References Cited

U.S. PATENT DOCUMENTS

| | | | |
|---|---|---|---|
| 4,601,098 | 7/1986 | Oda ......................................... | 438/298 |
| 4,728,619 | 3/1988 | Pfiester et al. ............................ | 437/34 |
| 4,996,669 | 2/1991 | Endoh et al. ............................. | 365/185 |
| 4,998,220 | 3/1991 | Eitan et al. ............................... | 365/185 |
| 5,019,881 | 5/1991 | Shin et al. ................................ | 357/23.5 |
| 5,088,060 | 2/1992 | Endoh et al. ............................. | 365/185 |
| 5,196,367 | 3/1993 | Lu et al. ................................... | 437/70 |
| 5,208,181 | 5/1993 | Chi ........................................... | 437/70 |
| 5,387,538 | 2/1995 | Moslehi .................................... | 437/67 |
| 5,393,689 | 2/1995 | Pfiester et al. ............................ | 437/52 |
| 5,422,297 | 6/1995 | Yamauchi ................................ | 438/289 |
| 5,448,090 | 9/1995 | Geissler et al. .......................... | 257/305 |
| 5,486,482 | 1/1996 | Yang ......................................... | 438/298 |
| 5,498,559 | 3/1996 | Chang ....................................... | 437/43 |
| 5,498,560 | 3/1996 | Sharma et al. ............................ | 437/43 |
| 5,556,798 | 9/1996 | Hong ......................................... | 437/43 |

FOREIGN PATENT DOCUMENTS 55-22856 2/1980 Japan .
1-241142 9/1989 Japan .

*Primary Examiner*—John Niebling
*Assistant Examiner*—Long Pham
*Attorney, Agent, or Firm*—Myers Bigel Sibley & Sajovec

[57] ABSTRACT

Methods of forming semiconductor active regions having channel-stop regions therein include the steps of forming an oxide layer and first nitride layer on a face of a semiconductor substrate and then patterning the first nitride layer to expose first portions of the oxide layer. The patterned first nitride layer is then used as a mask during implantation of dopants of second conductivity type into the substrate. A second nitride layer is then deposited on the exposed first portions of the oxide layer and on the first nitride layer. A second photoresist layer is then patterned and used as a mask to etch the second nitride layer and patterned first nitride layer, to expose second portions of the oxide layer. A third photoresist layer is then patterned to cover the first portions of the oxide layer. The patterned third photoresist layer and remaining portions of the patterned first and second nitride layers are then used as implant masks during implantation of second conductivity type dopants. These dopants are implanted to form relatively shallow preliminary channel-stop regions of second conductivity type in the substrate. A fourth photoresist layer is then patterned to expose the first portions of the oxide layer. Then, using the patterned fourth photoresist layer and the patterned second nitride layer as implant masks, first conductivity type dopants are implanted through the oxide layer and into the substrate. These dopants are implanted to form relatively shallow preliminary channel-stop regions of first conductivity type in the preliminary active regions of second conductivity type, adjacent the preliminary channel-stop regions of second conductivity type. The substrate then undergoes a thermal treatment to diffuse the dopants in the preliminary active and channel-stop regions, into the substrate.

20 Claims, 8 Drawing Sheets

METHODS OF FORMING SEMICONDUCTOR ACTIVE REGIONS HAVING CHANNEL-STOP ISOLATION REGIONS THEREIN

FIELD OF THE INVENTION

The present invention relates to semiconductor devices and fabrication methods, and more particularly to methods of forming electrically isolated semiconductor active regions in a semiconductor substrate.

BACKGROUND OF THE INVENTION

Device isolation techniques play an important role in the design and performance of highly integrated semiconductor circuits by electrically isolating regions and devices therein from adjacent devices and regions. Moreover, as the degree of integration in semiconductor circuits increases, there is a concomitant need to develop techniques for forming isolation regions which can be scaled to provide isolation regions having smaller dimensions, but without sacrificing the isolation capability of the regions.

One attempt to electrically isolate adjacent semiconductor active regions of opposite conductivity type from each other using channelstop isolation regions is disclosed by FIGS. 1-10. In particular, FIG. 1 illustrates the initial steps of forming a first oxide layer 12 on a face of a semiconductor substrate 10 of first conductivity type (e.g., P-type) and then forming a first nitride layer 14 on the first oxide layer 12. As illustrated by FIG. 2, the first nitride layer 14 is then patterned using a first photoresist mask 16 and then dopants of second conductivity type are implanted into the substrate 10, using the patterned first nitride layer 14 as a mask. The first photoresist mask 16 is then removed and a heat treatment step is performed to diffuse and drive-in the implanted dopants of second conductivity type to form second conductivity type active regions/wells 20 (e.g., N-type). The heat treatment step is also performed in an oxidizing ambient to grow field oxide isolation regions 18, using the patterned first nitride layer 14 as an oxidation mask.

Referring now to FIG. 4, the patterned first nitride layer 14 is then removed using a phosphoric acid solution and then dopants of first conductivity type are implanted into the substrate 10, using the field oxide isolation regions 18 as an implant mask. The implanted first conductivity type dopants are then diffused into the substrate 10 to form first conductivity type active regions/wells 22, between adjacent second conductivity type active regions/wells 20. The first oxide layer 12 and field oxide isolation regions 18 are then removed from the face of the substrate 10 using a buffered oxide etchant (SBOE) solution. As illustrated best by FIG. 5, the formation of the field oxide isolation regions 18 to be used as an implant mask can consume substantial amounts silicon at the surface of the substrate. Thus, removal of the field oxide isolation regions 18 can result in a substrate 10 having a relatively rough and nonplanar surface. Moreover, exposing the surface of the substrate 10 to the buffered oxide etchant can damage the surface and create defects therein.

Referring now to FIGS. 6–7, a second oxide layer 24 and second nitride layer 26 are then formed in sequence on the face of the substrate 10 and then the second nitride layer 26 is patterned, using a patterned second photoresist layer 28 as an etching mask. A third photoresist layer 36 is then patterned to expose those portions of the second oxide layer 24 extending opposite the active regions/wells 22 of first conductivity type. Dopants of second conductivity type are then implanted into the edges of the active regions/wells 22 of first conductivity type to form preliminary channel-stop regions therein, using the patterned second nitride layer 26 and the patterned third photoresist layer 36 as implant masks, as illustrated by FIG. 8.

Then, as illustrated best by FIG. 9, a fourth photoresist layer 38 is patterned to expose those portions of the second oxide layer 24 extending opposite the active regions/wells 20 of second conductivity type. Dopants of first conductivity type are then implanted into the edges of the active regions/wells 20 of second conductivity type to form preliminary channel-stop regions therein, using the patterned fourth photoresist layer 38 and patterned second nitride layer 26 as implant masks. Then, in FIG. 10, the dopants in the preliminary channel-stop regions of first and second conductivity type (32, 34) are diffused into the active regions of second and first conductivity type (20, 22), respectively, using a heat treatment step. During this heat treatment step, field oxide isolation regions 30 are formed in the openings in the patterned second nitride layer 26. The patterned second nitride layer 26 and field oxide isolation regions 30 are then removed using a phosphoric acid solution and buffered oxide etchant (SBOE) solution, respectively. As described above, removal of the field oxide isolation regions 30 with an etchant will expose a nonplanar surface of the substrate 10 and can cause defects therein.

Thus, notwithstanding the above described method, there continues to be a need for simpler and more economical methods of forming semiconductor active regions having channel-stop isolation regions therein, which preserve the integrity of the substrate surface and inhibit formation of defects therein.

SUMMARY OF THE INVENTION

It is therefore an object of the present invention to provide improved methods of forming semiconductor active regions having channel-stop isolation regions therein.

It is another object of the present invention to provide methods of forming semiconductor active regions having channel-stop isolation regions therein, which require a relatively limited number of process steps.

It is another object of the present invention to provide methods of forming semiconductor active regions at a surface of a semiconductor substrate, which preserve the integrity of the surface and inhibit formation of defects therein.

These and other objects, features and advantages of the present invention are provided by methods of forming a plurality of spaced semiconductor active regions having channel-stop regions therein, which include the steps of forming an oxide layer and first nitride layer on a face of a semiconductor substrate of first conductivity type and then patterning the first nitride layer to expose first portions of the oxide layer while covering second portions thereof. The patterned first nitride layer is then used as a mask during the implantation of dopants of second conductivity type through the exposed first portions of the oxide layer. The dose and energy level of the implanted dopants are preferably chosen at sufficient levels to completely penetrate the oxide layer and form preliminary active regions/wells of second conductivity type in the substrate.

A second nitride layer is then deposited on the exposed first portions of the oxide layer and on the first nitride layer. A second photoresist layer is then patterned on the second nitride layer and used as a mask to etch the second nitride layer and patterned first nitride layer, to expose the second portions of the oxide layer. A third photoresist layer is then patterned to cover the first portions of the oxide layer. The patterned third photoresist layer and remaining portions of the patterned first and second nitride layers are then used as implant masks during implantation of second conductivity type dopants through oxide layer. These dopants are implanted to form relatively shallow preliminary channel-stop regions of second conductivity type in the substrate. These preliminary channel-stop regions are preferably formed at the peripheral edges of the preliminary active regions.

A fourth photoresist layer is then patterned to expose the first portions of the oxide layer. Then, using the patterned fourth photoresist layer and the patterned second nitride layer as implant masks, first conductivity type dopants are implanted through the oxide layer and into the substrate. These dopants are implanted to form relatively shallow preliminary channel-stop regions of first conductivity type in the preliminary active regions of second conductivity type, adjacent the preliminary channel-stop regions of second conductivity type. The substrate then undergoes a thermal treatment to diffuse the dopants in the preliminary active and channel-stop regions, into the substrate.

Methods of the present invention therefore provide a plurality of active regions/wells of second conductivity type in the substrate. As will 10 be understood by those skilled in the art, first conductivity type field effect transistors having first conductivity type source and drain regions can be formed in the active regions and second conductivity type field effect transistors having second conductivity type source and drain regions can be formed in the substrate, in the regions between adjacent active regions/wells. The channel-stop regions also provide a high degree of electrical isolation between adjacent transistors and other active devices, even where active devices formed in adjacent regions are highly integrated.

DESCRIPTION OF PREFERRED EMBODIMENTS

Figure 1:
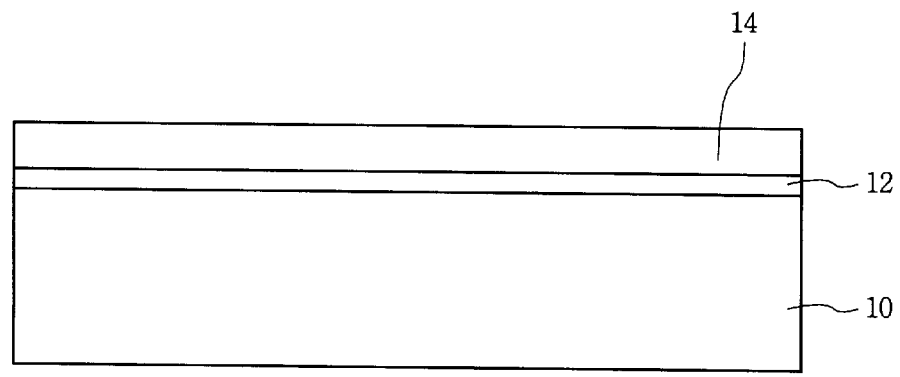
FIGS. 1–10 illustrate schematic cross-sectional views of intermediate structures illustrating one method of forming semiconductor active regions having channel-stop isolation regions therein, according to the prior art.
Figure 2:
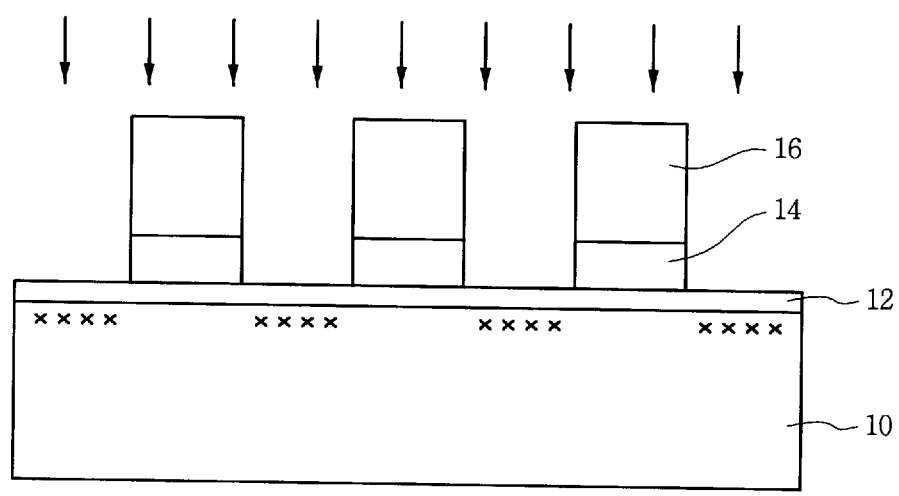
Figure 3:
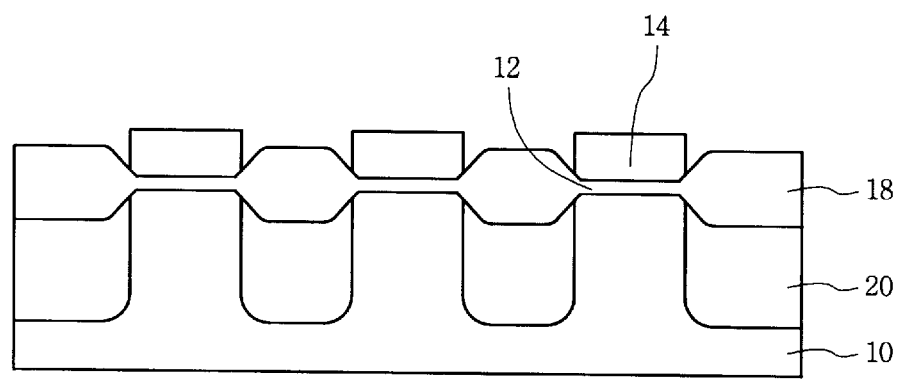
Figure 4:
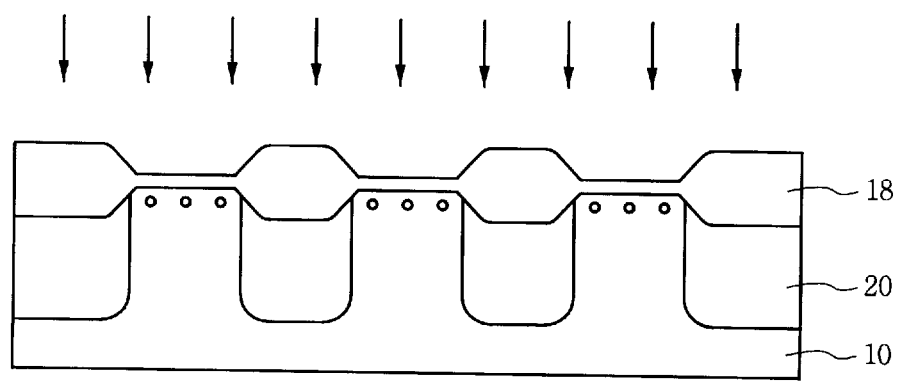
Figure 5:
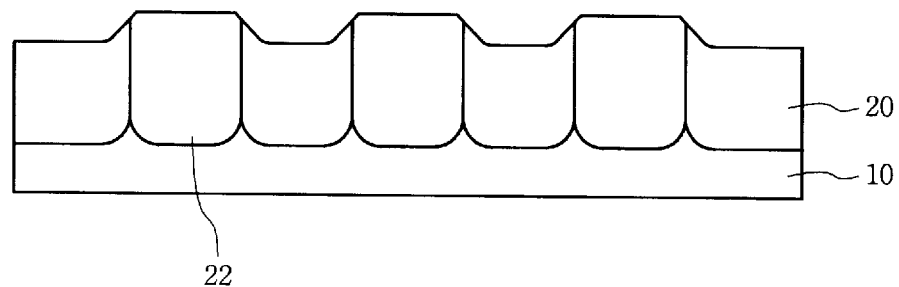
Figure 6:
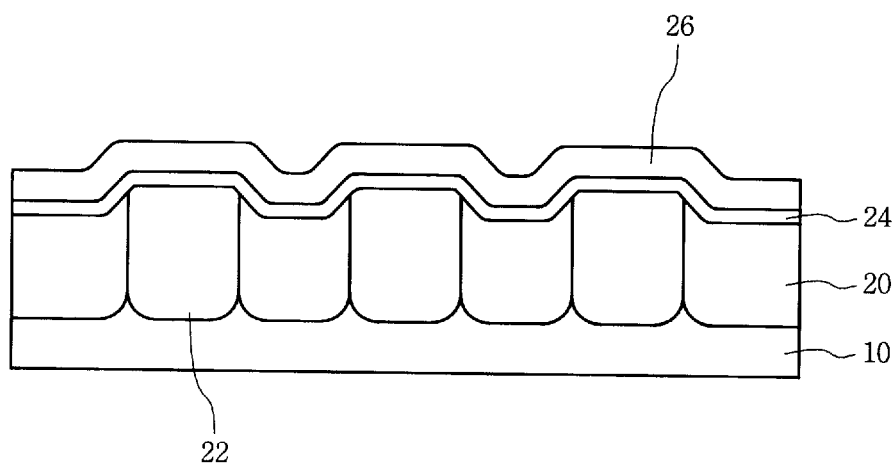
Figure 7:
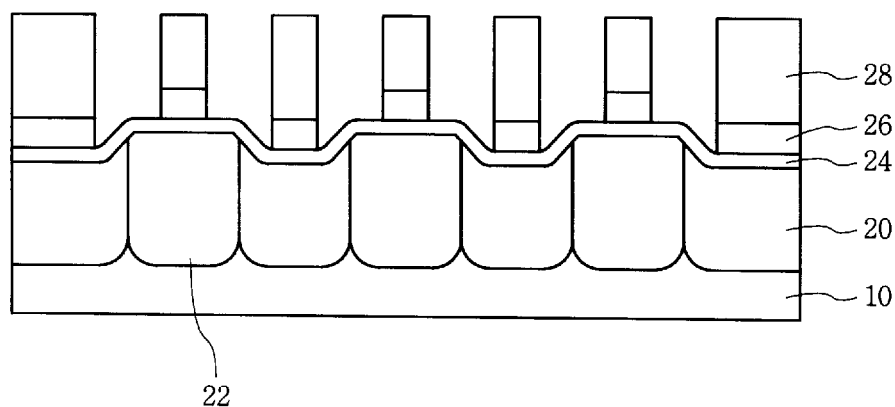
Figure 8:
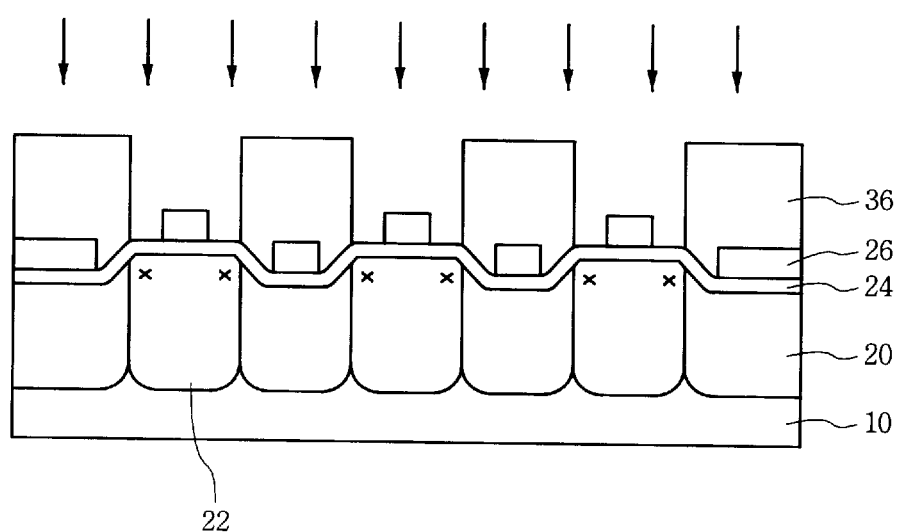
Figure 9:
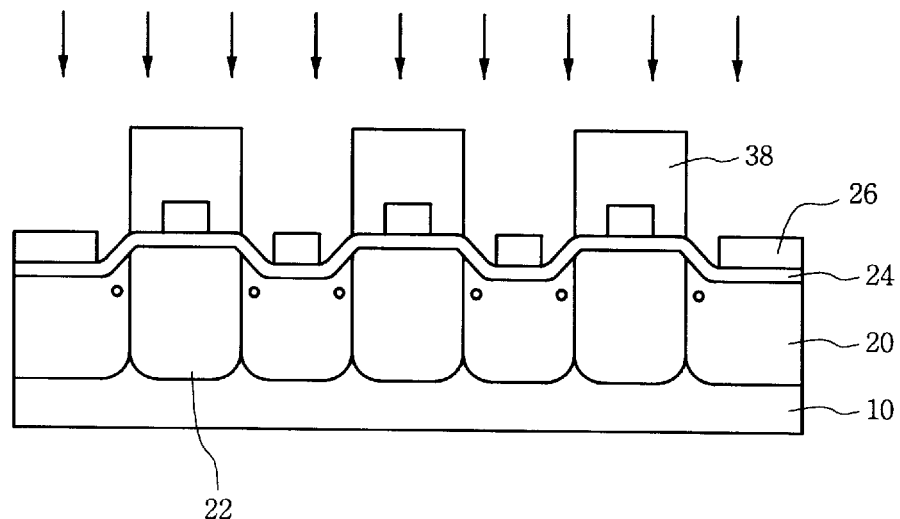
Figure 10:
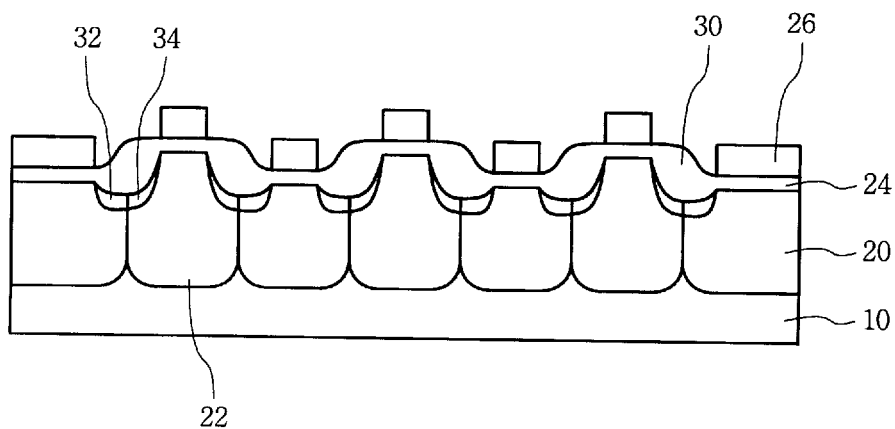
Figure 11:
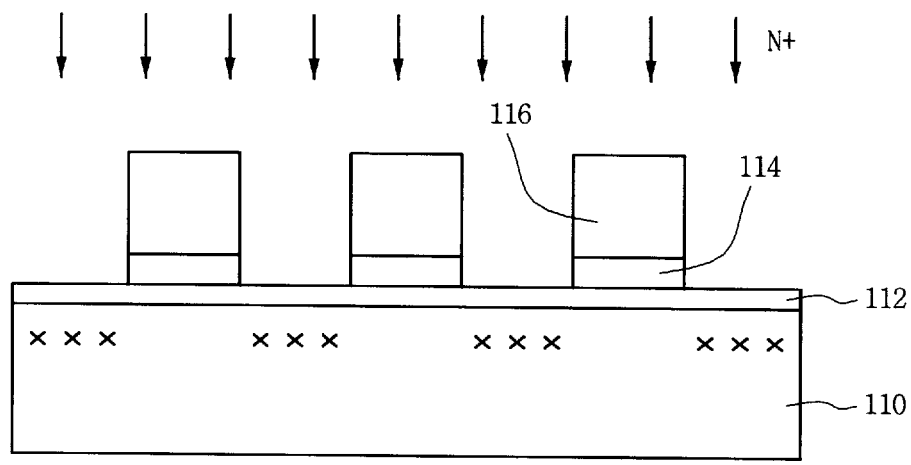
FIGS. 11–15 illustrate schematic cross-sectional views of intermediate structures illustrating a method of forming semiconductor active regions having channel-stop isolation regions therein, according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Like numbers refer to like elements throughout. Moreover, the terms "first conductivity type" and "second conductivity type" refer to opposite conductivity types such as P or N-type and each embodiment described and illustrated herein includes its complementary embodiment as well.

Referring now to FIGS. 11–15, a preferred method of forming semiconductor active regions having channel-stop isolation regions therein will be described. In particular, FIG. 1 1 illustrates an initial step of forming an oxide layer 112 (e.g., $SiO2_2$) having a thickness of about 250 $\text{Å}$, on a face of a semiconductor substrate 110 of first conductivity type (e.g., P-type).

The oxide layer 112 may be a thermally grown oxide layer or a deposited oxide layer, for example. This initial step is then followed by the step of depositing a first nitride layer 114 (e.g., $Si_3N_4$) having a thickness of about 500 $\text{Å}$ on the oxide layer 112 and then photolithographically patterning a first photoresist layer 116 on the first nitride layer 114 to expose first portions thereof. The first portions of the first nitride layer 114 are then selectively etched to pattern the first nitride layer 114, using the patterned first photoresist layer 116 as an etching mask. As illustrated best by FIG. 11, the patterned first nitride layer 114 exposes corresponding first portions of the oxide layer 112 and covers corresponding second portions thereof.

The patterned first nitride layer 114 is then used as a mask during the implantation of dopants of second conductivity type (e.g., N-type) through the exposed first portions of the oxide layer 112. The dose and energy level of the implanted dopants are preferably chosen at sufficient levels to completely penetrate the oxide layer 112 and form preliminary active regions/wells of second conductivity in the substrate 110. Thus, a relatively high concentration of second conductivity type dopants is formed beneath the face of the substrate 1 10, as illustrated by the cross-hatching.

Figure 12:
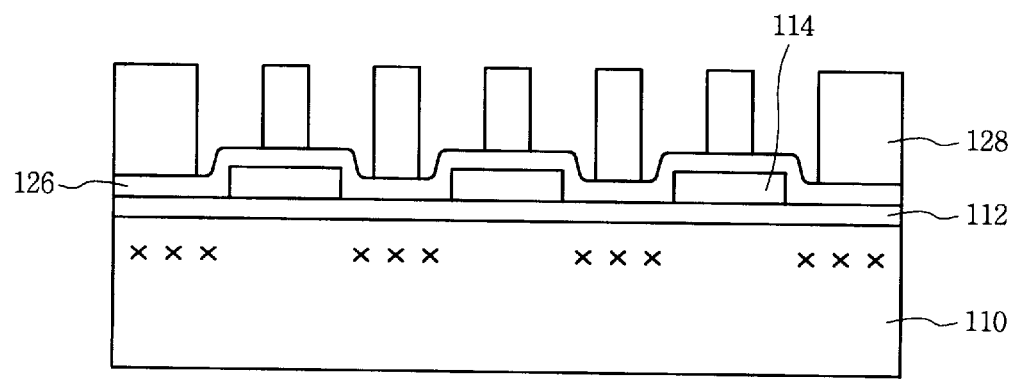

Referring now to FIG. 12, the patterned first photoresist layer 116 is then removed to expose the patterned first nitride layer 114. A second nitride layer 126 having a thickness of about 1500A is then deposited on the exposed first portions of the oxide layer 112 and on an upper surface of the patterned first nitride layer 114, as illustrated. A second photoresist layer 128 is then patterned on the second nitride layer 126. Alternatively, the second nitride layer 126 may be patterned to cover only the exposed first portions of the oxide layer 112 in the openings in the patterned first nitride layer 114. In this case, the second photoresist layer 128 may be patterned on the first and second nitride layers 114 and 126.

Figure 13:
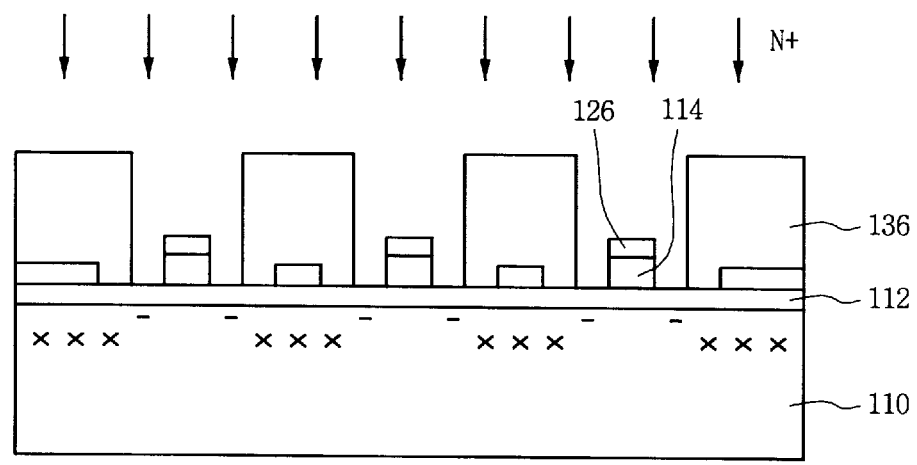

The patterned second photoresist layer 128 is then used as a mask during etching of the second nitride layer 126 and patterned first nitride layer 114, to expose the second portions of the oxide layer 112. The patterned second photoresist layer 128 is then removed. Referring now to FIG. 13, a third photoresist layer 136 is then patterned to cover the first portions of the oxide layer 112. Using the patterned third photoresist layer 136 and mesa structures containing remaining portions of the patterned first and second nitride layers 114 and 126 as implant masks, second conductivity type dopants are again implanted through the oxide layer 112 and into the substrate 110. As illustrated, these dopants are implanted at a lower energy level to form relatively shallow preliminary channel-stop regions of second conductivity type in the substrate 110. As illustrated, these preliminary channel-stop regions may be formed, at the peripheral edges of the preliminary active regions.

Figure 14:
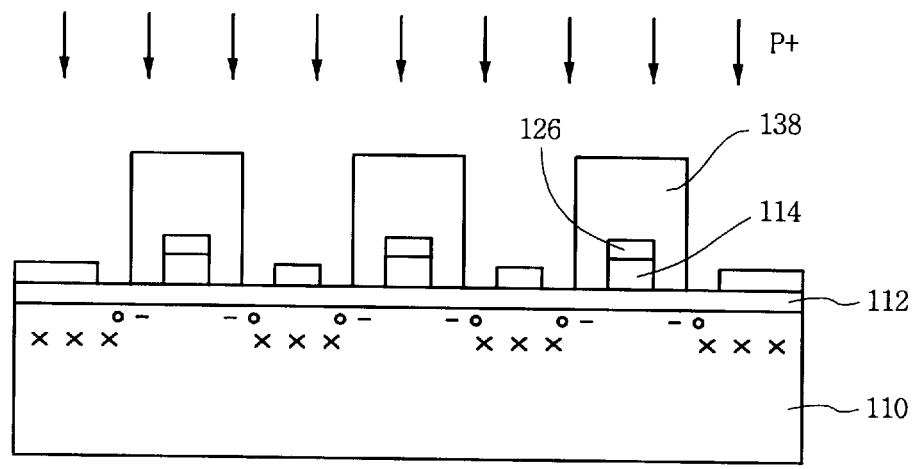
Figure 15:
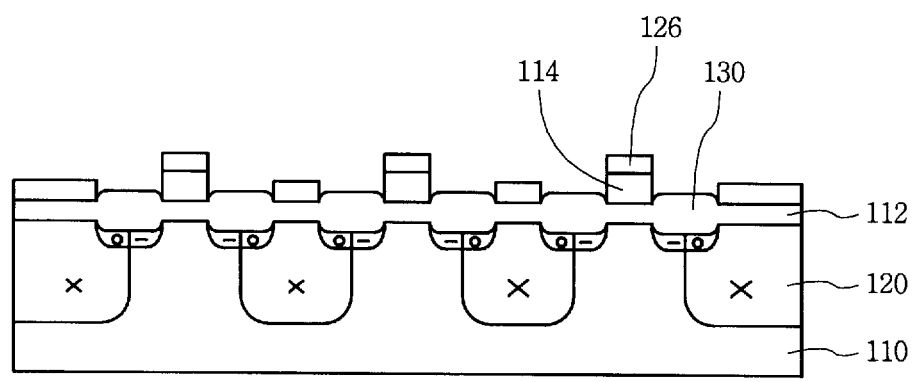

Referring now to FIG. 14, a fourth photoresist layer 138 is then patterned to expose the first portions of the oxide layer 112. Then, using the patterned fourth photoresist layer 138 and the patterned second nitride layer 126 as implant masks, first conductivity type dopants are implanted through the oxide layer 112 and into the substrate. As illustrated, these dopants are implanted to form relatively shallow preliminary channelstop regions of first conductivity type in the preliminary active regions of second conductivity type, adjacent the preliminary channel-stop regions of second conductivity type. As illustrated best by FIG. 15, the substrate 110 then undergoes a thermal treatment to diffuse the dopants in the preliminary active and channel-stop regions, into the substrate 110. During this treatment, field oxide isolation regions 130 are formed above the channelstop isolation regions. Here, the patterned first and second nitride layers are used as an oxidation mask.

Methods of the present invention therefore provide a plurality of active regions/wells 120 of second conductivity type in the substrate 110. As will be understood by those skilled in the art, first conductivity type field effect transistors having first conductivity type source and drain regions can be formed in the active regions 120 and second conductivity type field effect transistors having second conductivity type source and drain regions can be formed in the substrate 110, in the regions between adjacent active regions/wells 120. The channel-stop regions also provide a high degree of electrical isolation between adjacent transistors and other active devices, even where active devices formed in adjacent regions are highly integrated.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a plurality of spaced semiconductor active regions having channel-stop isolation regions therein, comprising the steps of:

forming an oxide layer on a face of a semiconductor substrate of a first conductivity type; then forming a first nitride layer on first portions and second portions of the oxide layer, over the face; then patterning the first nitride layer by removing a first part thereof, to expose the first portions of the oxide layer; then implanting dopants of a second conductivity type through the first portions of the oxide layer and into the face of the semiconductor substrate of first conductivity type to form preliminary active regions of second conductivity type therein, using the patterned first nitride layer as an implant mask; then patterning the first nitride layer again by removing a second part thereof to expose the second portions of the oxide layer;

implanting dopants of second conductivity type through the second portions of the oxide layer and into the face of the semiconductor substrate of first conductivity type to form preliminary channel-stop regions of second conductivity type therein;

implanting dopants of first conductivity type through the oxide layer and into the preliminary active regions of second conductivity type to form preliminary channel-stop regions of first conductivity type therein; and diffusing the dopants of first and second conductivity type in the preliminary regions to form active regions of second conductivity type, channel-stop regions of first conductivity type in the active regions of second conductivity type and channel-stop regions of second conductivity type in the semiconductor substrate of first conductivity type.

2. The method of claim 1, wherein said step of implanting dopants of first conductivity type comprises implanting dopants of first conductivity type through the first portions of the oxide layer and into the preliminary active regions of second conductivity type to form preliminary channel-stop regions of first conductivity type therein.

3. The method of claim 1, wherein said step of implanting dopants of first conductivity type follows said step of implanting dopants of second conductivity type to form preliminary channel-stop regions of second conductivity type.

4. The method of claim 1, wherein said step of patterning the first nitride layer again is preceded by the step of forming a second nitride layer on the exposed first portions of the oxide layer.

5. The method of claim 4, wherein said step of patterning the first nitride layer again is preceded by the step of forming a second nitride layer on the exposed first portions of the oxide layer and on the patterned first nitride layer.

6. The method of claim 4, wherein said step of patterning the first nitride layer again comprises patterning the first nitride layer and second nitride layer simultaneously to expose second portions of the oxide layer.

7. The method of claim 6, wherein said step of implanting dopants of second conductivity type to form preliminary channel-stop regions is preceded by the step of patterning a first photoresist layer to cover the first portions of the oxide layer.

8. The method of claim 7, wherein said step of implanting dopants of first conductivity type to form preliminary channel-stop regions is preceded by the step of patterning a second photoresist layer to cover the second portions of the oxide layer.

9. The method of claim 8, wherein said step of patterning the first nitride layer again comprises patterning the second nitride layer on the first portions of the oxide layer.

10. The method of claim 9, wherein said step of implanting dopants of first conductivity type comprises implanting dopants of first conductivity type into the preliminary active regions of second conductivity type, using the patterned second photoresist layer and patterned second nitride layer as implant masks.

11. A method of forming a plurality of spaced semiconductor active regions having channel-stop isolation regions therein, comprising the steps of:

forming an oxide layer on a face of a semiconductor substrate of a first conductivity type; then forming a first nitride layer on first portions and second portions of the oxide layer, over the face; then patterning the first nitride layer by removing a first part thereof, to expose the first portions of the oxide layer; then implanting dopants of a second conductivity type through the first portions of the oxide layer and into the face of the semiconductor substrate of first conductivity type to form preliminary active regions of second conductivity type therein, using the patterned first nitride layer as an implant mask; then patterning the first nitride layer again by removing a second part thereof, to expose the second portions of the oxide layer; then implanting dopants of second conductivity type through the second portions of the oxide layer and into the face of the semiconductor substrate to form preliminary channel-stop regions of second conductivity type therein; and diffusing the implanted dopants of second conductivity type from the preliminary regions into the semiconductor substrate to form active regions of second conductivity type and channel-stop regions of second conductivity type therein.

12. The method of claim 11, wherein said step of implanting dopants of second conductivity type to form preliminary channel-stop regions is preceded by the step of covering the first portions of the oxide layer with a first photoresist layer.

13. The method of claim 12, wherein said step of implanting dopants of second conductivity type to form preliminary channel-stop regions comprises implanting dopants of second conductivity type through the second portions of the oxide layer, using the patterned first photoresist layer as an implant mask.

14. The method of claim 13, wherein said step of implanting dopants of second conductivity type to form preliminary channel-stop regions comprises implanting dopants of second conductivity type through the second portions of the oxide layer, using the first nitride layer as an implant mask.

15. The method of claim 14, wherein said step of implanting dopants of second conductivity type to form preliminary active regions is followed by the step of forming a second nitride layer on the exposed first portions of the oxide layer.

16. The method of claim 15, wherein said step of patterning the first nitride layer again comprises patterning the second nitride layer by removing a part thereof.

17. The method of claim 16, further comprising the steps of patterning a second photoresist layer to cover the second portions of the oxide layer; and implanting dopants of first conductivity type into the preliminary active regions of second conductivity type, using the patterned second nitride layer and patterned second photoresist layer as implant masks.

18. A method of forming a plurality of spaced semiconductor active regions having channel-stop isolation regions therein, comprising the steps of:

forming an oxide layer on a face of a semiconductor substrate of a first conductivity type; then forming a first nitride layer on first portions and seconds portions of the oxide layer, over the face; then patterning the first nitride layer by removing a first part thereof using a first photoresist mask, to expose the first portions of the oxide layer; then implanting dopants of a second conductivity type through the first portions of the oxide layer and into the face of the semiconductor substrate of first conductivity type to form preliminary active regions of second conductivity type therein, using the patterned first nitride layer as an implant mask; then forming a second nitride layer on the exposed first portions of the oxide layer; then p1 patterning the second nitride layer by removing a part thereof and patterning the first nitride layer again by removing a second part thereof using a second photoresist mask, to expose the second portions of the oxide layer; than forming a third photoresist mask to expose the second portions of the oxide layer; then implanting dopants of second conductivity type through the second portions of the oxide layer and into the face of the semiconductor substrate of first conductivity type to form preliminary channel-stop regions of second conductivity type therein, using the patterned first nitride layer and third photoresist mask as implant masks; then forming a fourth photoresist mask to cover the second portions of the oxide layer;

implanting dopants of first conductivity type through the oxide layer and into the preliminary active regions of second conductivity type to form preliminary channel-stop regions of first conductivity type therein, using the patterned second nitride layer and fourth photoresist mask as implant masks; and diffusing the dopants of first and second conductivity type in the preliminary regions to form active regions of second conductivity type, channel-stop regions of first conductivity type in the active regions of second conductivity type and channel-stop regions of second conductivity type in the semiconductor substrate of first conductivity type.

19. The method of claim 18, wherein said step of forming a second nitride layer comprises forming a second nitride layer on the exposed first portions of the oxide layer and on the patterned first nitride layer.

20. The method of claim 19, wherein said step of patterning the second nitride layer comprises patterning the second nitride layer and the first nitride layer to expose the second portions of the oxide layer and expose areas within the first portions of the oxide layer.

* * * * *